United States Patent
Yang et al.

(10) Patent No.: US 8,739,003 B1
(45) Date of Patent: *May 27, 2014

(54) METHOD AND APPARATUS FOR DECODING A DATA SECTOR INCLUDING USER DATA AND NON-USER DATA

(71) Applicant: Marvell International Ltd., Hamilton (BM)

(72) Inventors: Xueshi Yang, Cupertino, CA (US); Gregory Burd, San Jose, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 13/842,221

(22) Filed: Mar. 15, 2013

Related U.S. Application Data (63) Continuation of application No. 12/702,186, filed on Feb. 8, 2010, now Pat. No. 8,402,351.

(60) Provisional application No. 61/151,018, filed on Feb. 9, 2009.

(51) Int. Cl.
*H03M 13/00* (2006.01)

(52) U.S. Cl.
USPC .................. 714/779; 711/118; 711/162

(58) Field of Classification Search
USPC ................... 714/779; 711/118, 162
See application file for complete search history.

(56) References Cited

U.S. PATENT DOCUMENTS

| | | | |
|---|---|---|---|
| 5,224,106 A * | 6/1993 | Weng | 714/755 |
| 2006/0206669 A1 | 9/2006 | Zhu et al. | |

* cited by examiner

*Primary Examiner* — Guy Lamarre (57) ABSTRACT

The disclosure provides a method that includes receiving a data sector of a plurality of data tiles, wherein each of the plurality of data tiles includes either nuisance data or user data, decoding the received data sector, using an error correction code, to generate a decoded data sector, and determining an error in the decoded data sector. The method further includes identifying, in response to determining the error, at least one data tile from a first plurality of data tiles, such that each of the identified at least one data tiles potentially includes nuisance data, and generating a modified data sector from the received data sector, by correcting at least one of the at least one data tiles in the received data sector.

18 Claims, 6 Drawing Sheets

METHOD AND APPARATUS FOR DECODING A DATA SECTOR INCLUDING USER DATA AND NON-USER DATA

CROSS REFERENCE TO RELATED APPLICATIONS

The present disclosure is a continuation of and claims priority to U.S. patent application Ser. No. 12/702,186, filed Feb. 8, 2010, now U.S. Pat. No. 8,402,351, issued Mar. 19, 2013, which claims priority to U.S. Patent Application No. 61/151,018, filed Feb. 9, 2009, which are incorporated herein by reference.

TECHNICAL FIELD

Embodiments of the present disclosure relate to error correction coding, and more specifically to error correction coding with nuisance data.

BACKGROUND

Nuisance data (also referred to as auxiliary data or dummy data) is used in a communication system for a variety of reasons. For example, a data sector in a communication system can have a capacity of 4 Kilobytes (KB), while there are 3 KB of user data available for storing in the data sector. In such a case, the remaining 1 KB of the data sector is filled with nuisance or dummy data. Thus, the 4 KB data sector has 3 KB of user data and 1 KB of nuisance data.

In various applications, nuisance data have specific bit patterns, to distinguish nuisance data from user data. For example, nuisance data can include only 1s, only 0s, alternating 1s and 0s (e.g., 10101 ... 01010), or any other appropriate bit pattern. In some applications, it is desirable to exploit specific bit patterns of nuisance data for encoding and/or decoding data sectors.

SUMMARY

In various embodiments, the present disclosure provides a method that includes receiving a data sector comprising a plurality of data tiles, wherein each of the plurality of data tiles includes either nuisance data or user data, decoding the received data sector, using an error correction code, to generate a decoded data sector, and determining an error in the decoded data sector. The method further includes identifying, in response to determining the error, at least one data tile from first plurality of data tiles, such that each of the identified at least one data tile potentially includes nuisance data, and generating a modified data sector from the received data sector, by correcting at least one of the at least one data tile in the received data sector.

In accordance with an embodiment, the first decoded data sector is a first decoded data sector, and the method further includes decoding the modified data sector, using the error correction code, to generate a second decoded data sector.

In accordance with an embodiment, the modified data sector is a first modified data sector, the first modified data sector is generated by correcting each of the at least one data tile in the data sector, the at least one data tile includes at least a first data tile and a second data tile, and the method further includes determining an error in the second decoded data sector, generating, in response to determining the error in the second decoded data sector, a second modified data sector from the received data sector by correcting the first data tile in the received data sector, and decoding the second modified data sector, using the error correction code, to generate a third decoded data sector.

In accordance with an embodiment, the method further includes determining an error in the third decoded data sector, generating, in response to determining the error in the third decoded data sector, a third modified data sector from the data sector, by correcting the second data tile in the received data sector, and decoding the third modified data sector, using the error correction code, to generate a fourth decoded data sector.

In accordance with an embodiment, the correcting at least one of the at least one data tiles in the received data sector further includes replacing data bits in the at least one of the at least one data tile by original data bits of nuisance data.

In accordance with an embodiment, the identifying the at least one data tile further includes determining a hamming weight of each of the plurality of data tiles, and identifying the at least one data tile based on the determined hamming weight of each of the plurality of data tiles.

In accordance with an embodiment, the identifying the at least one data tile further includes identifying any data tile to potentially include nuisance data when the hamming weight of the data tile is higher than a threshold hamming weight.

In accordance with an embodiment, the generating the modified data sector further includes generating the modified data sector from the data sector, by correcting each of the at least one data tile in the received data sector.

In accordance with an embodiment, the nuisance data includes only data bits having a value of 1.

In various embodiments, the present disclosure provides an apparatus that includes a decoder unit configured to receive a data sector comprising a plurality of data tiles, wherein each of the plurality of data tiles includes either nuisance data or user data. The decoder unit includes an error correction code (ECC) decoder unit configured to decode the received data sector, using an error correction code, to generate a decoded data sector, and determine an error in the decoded data sector, a data tile identification unit configured to identify, in response to determining the error, at least one data tile from the plurality of data tiles, such that each of the identified at least one data tiles potentially includes nuisance data, and a data tile correction unit configured to generate a modified data sector from the received data sector, by correcting at least one of the at least one data tiles in the received data sector.

In an embodiment, the decoded data sector is a first decoded data sector and the ECC decoder unit is further configured to decode the modified data sector, using the error correction code, to generate a second decoded data sector.

In an embodiment, the modified data sector is a first modified data sector, the data tile correction unit is configured to generate the first modified data sector by correcting each of the at least one data tiles in the received data sector, the at least one data tile includes at least a first data tile and a second data tile, the ECC decoder unit is further configured to determine an error in the second decoded data sector, the data tile correction unit is further configured to generate, in response to the determined error in the second decoded data sector, a second modified data sector from the received data sector by correcting the first data tile in the received data sector, and the ECC decoder unit is further configured to decode the second modified data sector, using the error correction code, to generate a third decoded data sector.

In an embodiment, the ECC decoder unit is further configured to determine an error in the third decoded data sector, the data tile correction unit is further configured to generate, in response to the determined error in the third decoded data sector, a third modified data sector from the received data sector by correcting the second data tile in the received data sector, and the ECC decoder unit is further configured to decode the third modified data sector, using the error correction code, to generate a fourth decoded data sector.

In an embodiment, the data tile correction unit is configured to correct at least one of the at least one data tiles in the received data sector by replacing data bits in the at least one of the at least one data tiles by original data bits of nuisance data.

In an embodiment, the data tile identification unit is configured to identify the at least one data tile by being configured to determine a hamming weight of each of the plurality of data tiles, and identify the at least one data tile based on the hamming weight of each of the first plurality of data tiles.

In an embodiment, the data tile identification unit is configured to identify the at least one data tiles by being configured to identify a data tile to potentially include nuisance data when the hamming weight of the data tile is higher than a threshold hamming weight.

In an embodiment, the data tile correction unit is configured to generate the modified data sector from the received data sector by correcting each of the at least one data tiles in the received data sector.

BRIEF DESCRIPTION OF THE DRAWINGS

In the following detailed description, reference is made to the accompanying drawings which form a part hereof, wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments of the present disclosure; however, the order of description should not be construed to imply that these operations are order dependent or need to be discrete operations.

The description may use the phrases "in an embodiment," or "in embodiments," which may each refer to one or more of the same or different embodiments. The phrase "in various embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

A data sector, as used in this disclosure and unless otherwise mentioned, is a unit of data that comprises a plurality of bits of data. Thus, a data sector includes a plurality of data bits. A data sector comprises multiple segments or data tiles. A data tile, as used in this disclosure and unless otherwise mentioned, is also a unit of data that comprises a plurality of bits of data. Thus, a data tile includes a plurality of data bits. A data sector and/or a data tile can be generated (e.g., by combining a plurality of data bits that are intended to be included in the data sector and/or the data tile), encoded, transmitted, stored, decoded, and/or any other appropriate data processing operation may be performed on a data sector and/or a data tile. For example, encoding a data sector implies encoding data bits included in the data sector.

Figure 1:
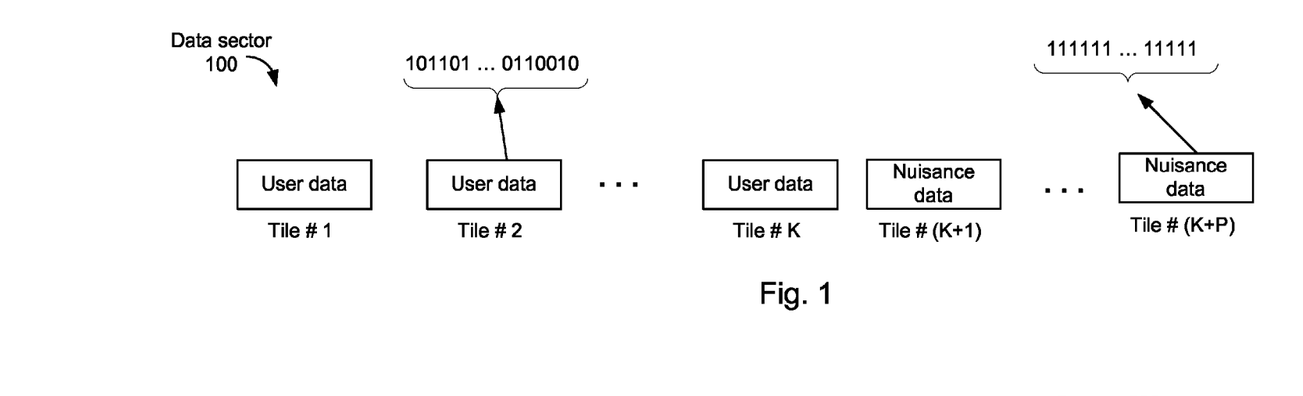
FIG. 1 illustrates an example of a data sector.

FIG. 1 illustrates an example data sector 100. The data sector 100 is of any appropriate size, e.g., 4 KB, 8 KB, 1 Megabyte (MB), or the like. The data sector 100 is divided in multiple segments or data tiles, illustrated as tile 1, tile 2, ..., tile K, tile (K+1), ..., tile (K+P), where K and P are any appropriate non-zero integers. Thus, the data sector 100 has (K+P) number of data tiles.

Each of the (K+P) number of data tiles is of similar or different sizes. Henceforth in this disclosure, and unless otherwise mentioned, each of the data tiles are assumed to be of similar size. However, the teachings of the disclosure may, in various embodiments, be also applied to data sectors with different sizes. In case each of the (K+P) number of data tiles is of similar size, then the size of each of the data tiles depends on the size of the data sector 100 and the number (K+P). For example, for a 4 KB data sector with 16 data tiles, each data tile consists of 256 bytes of data.

Each of the data tiles 1, ..., (K+P) stores either user data or nuisance data. For example, data tiles 1, ..., K are illustrated to store user data, and data tiles (K+1), ..., P are illustrated to store nuisance data.

User data refers to, for example, intended, regular, normal and/or useful data bits stored, transmitted and/or processed by a data processing system. Nuisance data refers to, for example, dummy, nuisance and/or auxiliary data used to fill one or more data tiles of a data sector in case enough user data is not available to fill the one or more data tiles of the data sector. Thus, data bits that are not nuisance data are user data. A user data tile, as used in this disclosure and unless otherwise mentioned, refers to a data tile that includes user data. A nuisance data tile, as used in this disclosure and unless otherwise mentioned, refers to a data tile that includes nuisance data.

For example, in an embodiment, the data sector 100 has a capacity of 4 KB and includes 16 data tiles (e.g., each of 256 Bytes capacity); while there are 3 KB of user data available for storing in the data sector 100. Thus, 12 data tiles are used for storing user data (i.e., K=12, and there are 12 user data tiles), and the remaining 4 data tiles are filled with nuisance data (i.e., P=4, and there are 4 nuisance data tiles). In some cases, data tiles may include both user data and nuisance data. In such cases, the data tiles are considered to be user data tiles (since they include useful user data) and are handled as user data tiles.

The data sector 100 is illustrated to include user data in the first K data tiles and nuisance data in the last P data tiles. However, in various other embodiments, the user data tiles and the nuisance data tiles may not be arranged in such an order. For example, one or more nuisance data tiles may be interleaved between one or more user data tiles.

As nuisance or dummy data is used, for example, to fill up empty data tiles (e.g., data tiles that are not filled by user data), the data bits of nuisance data is not configured to represent meaningful information (other than, for example, indicating that the data bits represent nuisance or dummy data). Thus, in various applications, nuisance data bits are configured to have specific bit patterns, for example, to distinguish nuisance data from user data. For example, nuisance data may include only 1s (i.e., all bits having value 1), only 0s (i.e., all bits having value 0), alternating 1s and 0s (e.g., 10101 . . . 01010), or any other appropriate bit pattern. The example of nuisance data tile (K+P) of FIG. 1 is illustrated to include only 1s. On the other hand, user data includes any number of 1s and 0s, and in any order, as illustrated in the example of user data tile 2 in FIG. 1.

A hamming weight of a binary data string is an indication of a number of 1s in the data string. For example, hamming weight of a 4 bit data 1011 is 3, another 4 bit data 1111 is 4, and so on. In case a nuisance data tile includes only 1s, this is reflected in the hamming weight of the data tile. For example, the hamming weight of a 256 byte nuisance data tile with only 1s is 2048, and the hamming weight of another 256 byte nuisance data tile with only 0s is 0. On the other hand, user data typically include, on an average, approximately a similar number of 1s and 0s. For example, around half of the bits of a user data tile may be 1s, and around the remaining half may be 0s, although this may not necessarily be the case for some user data tiles. At the least, probability of a user data tile having all 1s (or all 0s) is very low. Thus, a user data tile and a nuisance data tile may be distinguished, with very low error probability, using, for example, hamming weights of the data tiles.

Figure 2:
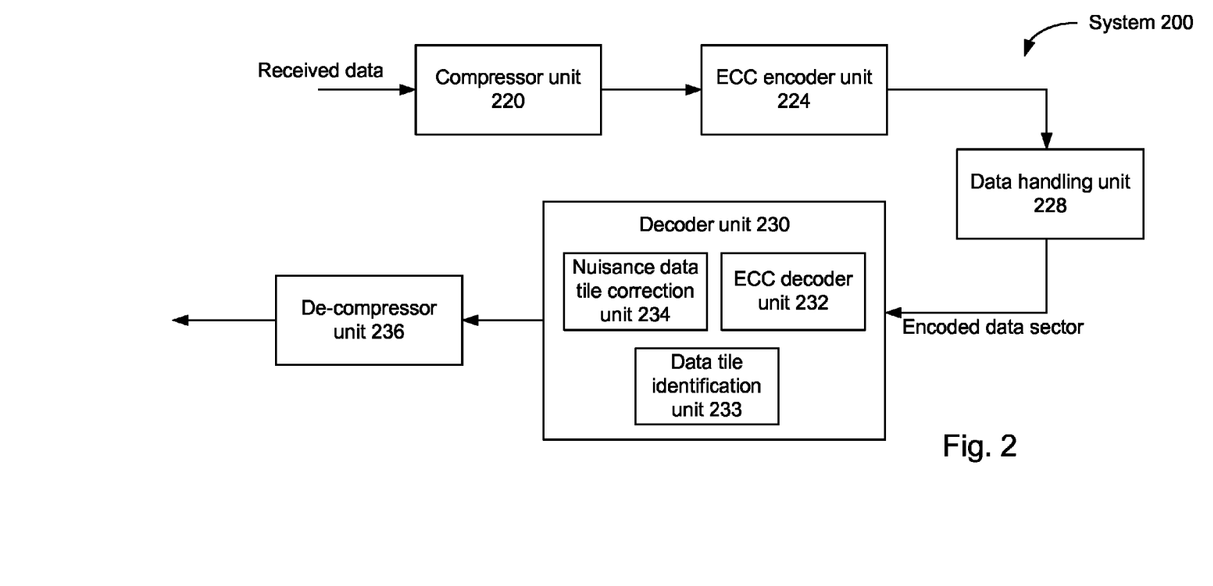
FIG. 2 schematically illustrates an example of a communication system.

FIG. 2 schematically illustrates an example of a communication system 200. The system 200 includes a data compressor unit 220 configured to compress received data using any appropriate data compression algorithm. In various embodiments, while compressing the received data, the compressor unit 220 generates a data sector that includes the compressed data.

For example, in various embodiments, the compressor unit 220 receives 6 KB of user data, and compresses the received data into 3 KB of user data. The compressor unit 220 (or an appropriate data sector generator unit, not illustrated in FIG. 2, operatively coupled to the compressor unit 220) generates a data sector of 4 KB size that includes 16 data tiles, each of 256 bytes (although any other size of the data sector, with any different number of data tiles is also possible). The compressor unit 220 includes 3 KB of user data in 12 user data tiles, and loads nuisance data in the remaining 4 data tiles. Thus, the compressor unit 220 generates a data sector that includes 12 user data tiles and 4 nuisance data tiles.

An error correction code (ECC) encoder unit 224 receives the data sector including the compressed data, and encodes the data sector using an appropriate ECC algorithm.

In various other embodiments, the ECC encoder unit 224 may also generate a data sector directly from received data (e.g., in case the compressor unit 220 is absent). For example, the ECC encoder unit 224 receives 6 KB of user data, and divides the received data in two parts, each part including 3 KB of data (although other ways of dividing the data may also be possible). The ECC encoder unit 224 then generates 2 data sectors (each of 4 KB, and including 16 data tiles each) such that each data sector comprises 12 user data tiles and 4 nuisance data tiles. The ECC encoder unit 224 encodes the data sector using an appropriate ECC algorithm.

In various embodiments, the compression unit 220 or the ECC encoder unit 224 also generates a tile indicator field associated with a data sector. The tile indicator field indicates identities of data tiles included in the associated data sector. For example, the tile indicator field identifies each of the data tiles as a user data tile or a nuisance data tile. The size of the tile indicator field depends, for example, on the number of data tiles in a data sector. For example, for a data sector comprising 16 data tiles, the tile indicator field is 2 bytes, each bit of the tile indicator field identifying a corresponding data tile. If an $i^{th}$ bit of the tile indicator field is 1, then a corresponding data tile (e.g., the $i^{th}$ data tile) is, for example, a user data tile. And if a $j^{th}$ bit of the tile indicator field is 0, then the corresponding data tile (e.g., the $j^{th}$ data tile) is a nuisance data tile.

The data sector including the encoded data is received by a data handling unit 228. In various embodiments, the compression unit 220 and/or the ECC encoder unit 224 compresses and/or encodes the tile indicator field as well, and transmits the tile indicator field (e.g., by including the tile indicator field in the corresponding data sector) to the data handling unit 228. The data handling unit 228 performs one or more operations on the received data sector, including but not limited to storing (e.g., in a memory or any appropriate storage device), processing, transmitting (e.g., over one or more wired and/or wireless communication conduit or channels), and/or performing other operations on the data sector.

A decoder unit 230 receives the data sector from the data handling unit 228, and decodes the encoded data included in the data sector using any appropriate ECC decoding algorithm. The decoder unit 230 includes an ECC decoder unit 232 for performing the ECC decoding operation. The decoder unit 230 also includes a data tile identification unit 233 and a nuisance data tile correction unit 234. The decoded data is decompressed by a data de-compressor unit 236.

While decoding the received data sector, the ECC decoder unit 232 corrects one or more errors in the user data and/or nuisance data in the data tiles of the data sector. However, if the number and/or nature of errors in the encoded data sector received by the ECC decoder unit 232 are beyond a threshold value, all errors in the encoded data sector may not be successfully corrected by the ECC decoder unit 232. In such scenarios, the data tile identification unit 233 identifies those data tiles that are possibly nuisance data tiles (e.g., identifies with high probability some of the data tiles as nuisance data tiles), the nuisance data tile correction unit 234 corrects the nuisance data in one or more of the identified data tiles, and the ECC decoder unit 232 decodes the data sector with the corrected data tiles, to successfully decode the received encoded data sector, as will be explained herein later in more detail.

One or more of the units illustrated in system 200 may be included in a single device, or may be included in different devices. Also, in various embodiments, one or more units (e.g., data compressor unit 220 and/or data de-compressor unit 236) illustrated in system 200 may not be present in the system. Although illustrated as separate units, in various embodiments, one or more of the illustrated units (e.g., the ECC decoder unit 232, data tile identification unit 233 and/or nuisance data tile correction unit 234) may be combined at least in part.

Figure 4A:
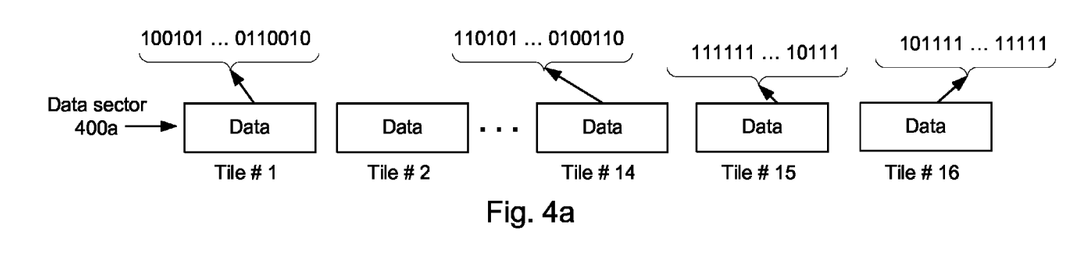
FIG. 4a illustrates an example of a data sector.

FIG. 4a illustrates an example of a data sector 400a received by the decoder unit 230. The data sector 400a includes 16 data tiles. Examples of data bits in some of the data tiles are also illustrated in FIG. 4a. When the decoder unit 230 receives the data sector 400a, the decoder unit 230 is unaware of whether a data tile is a nuisance data tile or a user data tile.

Figure 3:
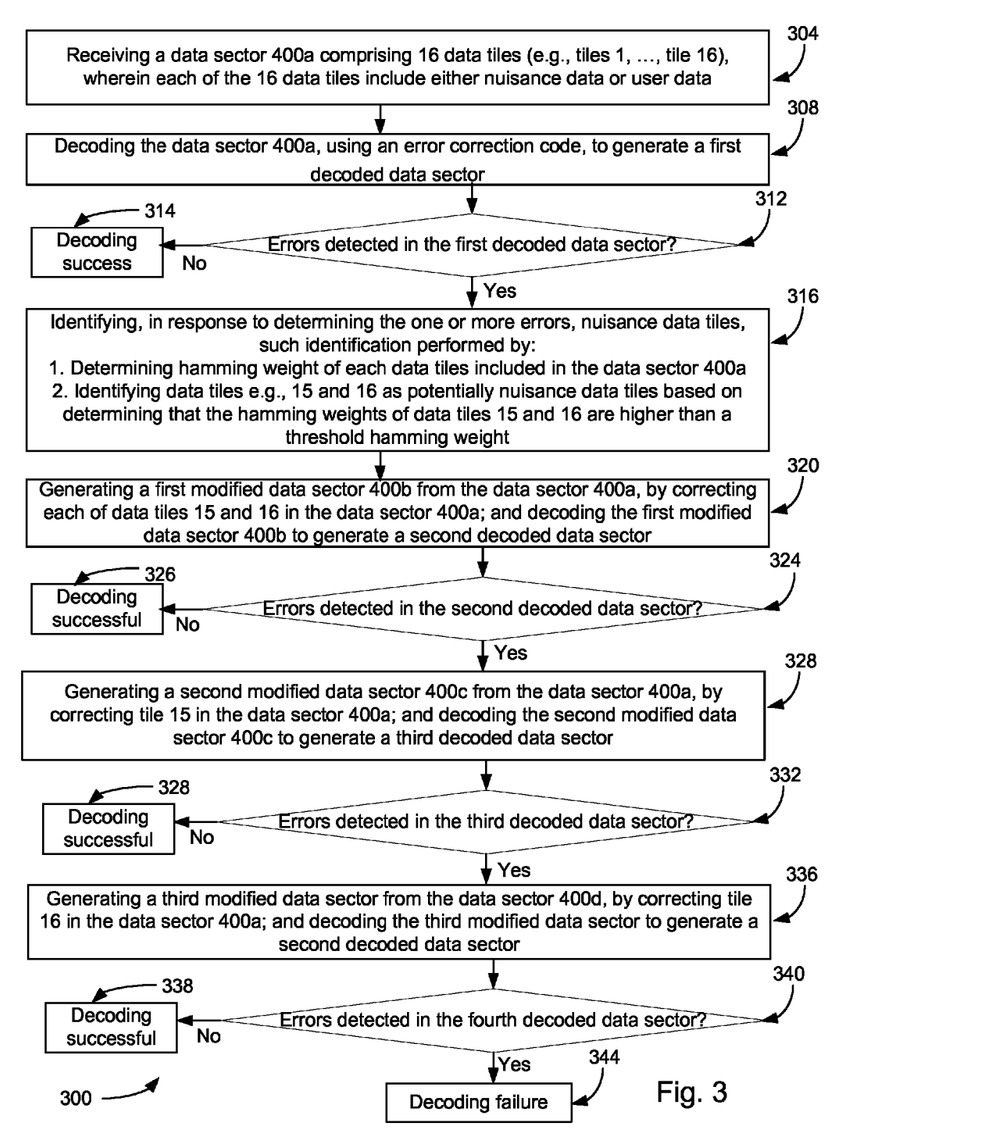
FIG. 3 illustrates an example of a method for decoding a data sector.

FIG. 3 illustrates an example of a method 300 for decoding the data sector 400a by the decoder unit 230. Referring to FIGS. 2, 3 and 4a, method 300 includes, at 304, the decoder unit 230 receiving the data sector 400a from the data handling unit 228. As illustrated in FIG. 4a and as previously discussed, data sector 400a includes 16 data tiles, each of which includes either user data or nuisance data. Of course, the method of FIG. 3 can be extended to other data sector arrangements.

At 308, the ECC decoder unit 232 decodes the data sector 400a using an appropriate ECC, to generate a first decoded data sector. As previously discussed, while decoding the data sector 400a, one or more errors in the data sector 400a can be corrected by the ECC decoder unit 232. However, if the number and/or nature of errors in the received data sector 400a are beyond an error correction capacity of the ECC decoder unit 232, then one or more of the errors in the data sector 400a cannot be corrected by the decoding operation at 308.

Accordingly, at 312, the ECC decoder unit 232 checks to see if all errors have been corrected by the decoding operation at 308 (e.g., check for errors in the first decoded data sector). In case no errors are detected, at 314, the decoding operation is successful.

However, in case one or more errors are detected at 312, the data tile identification unit 233 identifies potential nuisance data tiles from data tiles 1, . . . , 16. That is, the data tile identification unit 233 identifies one or more data tiles that potentially include nuisance data. As previously discussed, nuisance data has a specific pattern (e.g., all 1s, all 0s, etc.). Henceforth in this disclosure, for the sake of brevity and unless otherwise mentioned, it is assumed that the nuisance data tiles are generated with all 1s, although this may not necessarily be the case. For example, nuisance data tiles may also be generated with other bit patterns (e.g., all 0s), and the teachings of the disclosure may also be applied to these bit patterns as well.

In case nuisance data is generated (e.g., by the data compressor unit 220 and/or the ECC encoder unit 224, see FIG. 2) using all 1s, then the nuisance data tiles includes all 1s. However, while the data sector is processed in the data handling unit 228, nuisance data included in one or more nuisance data tiles may be corrupted (e.g., one or more errors induced in the nuisance data by, for example, change of one or more nuisance data bits from 1s to 0s). Thus, in the data sector 400a received by the decoder unit 230, nuisance data tiles may not include all 1s. However, as the original nuisance data tiles included all 1s (and assuming a low error rate in the nuisance data), the nuisance data tiles in the data sector 400a typically have a high number of 1s as compared to 0s (even after corruption of one or more bits of nuisance data).

In contrast, as previously discussed, user data tiles in the data sector generated by the data compressor unit 220 and/or the ECC encoder unit 224 typically have approximately an equal number of 1s and 0s. At the least, with very high probability, in a typical user data tile, number of 1s does not outnumber number of 0s by a large margin (even if errors are induced in data bits of one or more user data tiles).

Accordingly, in the data sector 400a received by the decoder unit 230, nuisance data tiles are distinguished, with high probability, from user data tiles using the bit pattern of the data tiles. For example, those data tiles in which the number of 1s outnumbers the number of 0s by a large margin are identified as potential nuisance data tiles. As the hamming weight of a data tile is an indication of number of 1s in the data tile, hamming weights of data tiles is used to distinguish nuisance data tiles from the user data tiles. For example, for a 256 byte nuisance data tile with all 1s, the hamming weight is 2048. However, because of potential errors in a nuisance data tile, some of the 1s change to zero while the data sector is, for example, being processed by the data handling unit 228. Accordingly, a nuisance data tile in the data sector 400a mostly includes 1s, with a few 0s included because of induced error. However, in spite of one or more errors, a typical nuisance data tile in data sector 400a most likely has a high hamming weight as compared to a hamming weight of a typical user data tile in the data sector 400a. Accordingly, in case a hamming weight of a data tile is higher than a threshold hamming weight (e.g., hamming weight of 1900 for 256 byte data tiles), the data tile is identified as a nuisance data tile. In another example where nuisance data includes only 0s, a data tile is identified as a nuisance data tile if a corresponding hamming weight is less than a threshold hamming weight of, for example, 150 for 256 byte data tiles.

Figure 4B:
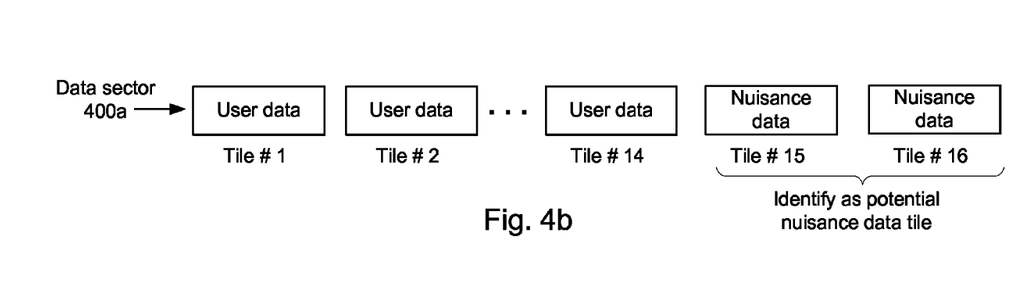
FIG. 4b illustrates the example of a data sector of FIG. 4a, in which potential nuisance data tiles are identified.

Referring again to FIG. 4a, data tiles 15 and 16 have mostly 1s (i.e., very few 0s) compared to data tiles 1, . . . , 14. Thus, data tiles 15 and 16 have high hamming weights (e.g., higher than a threshold hamming weight of 1900). Accordingly, referring again to FIG. 3, at 316, data tile identification unit 233 identifies nuisance data tiles, as illustrated in FIG. 4b. Such identification is performed by determining the hamming weight of each of the data tiles 1, . . . , 16 included in the data sector 400a, and identifying e.g., data tiles 15 and 16 as potential nuisance data tiles based on determining that the hamming weights of data tiles 15 and 16 are higher than the threshold hamming weight.

Figure 4C:
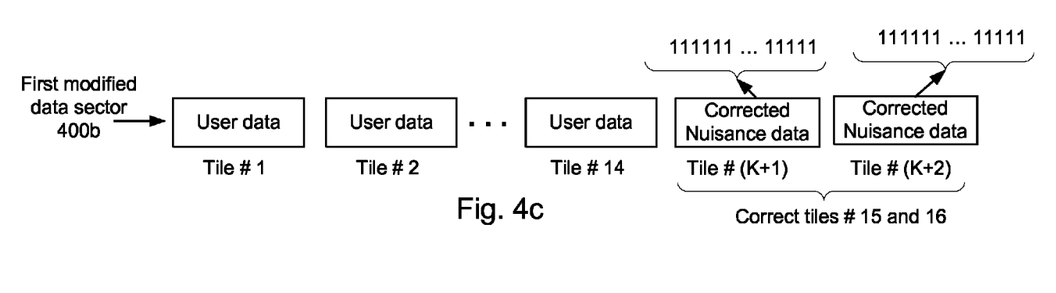
FIG. 4c illustrates an example of a first modified data sector.

Once data tiles 15 and 16 are identified as potential nuisance data tiles, data in both the data tiles are corrected. For example, the data tiles 15 and/or 16 include a few 0s. In case the data tiles 15 and 16 are indeed nuisance data tiles (e.g., if the identification of the potential nuisance data tiles is correct), then the nuisance data tiles are supposed to include all only (and no 0s). Accordingly, assuming that the data tiles 15 and 16 are correctly identified as nuisance data tiles, at 320, the nuisance data tile correction unit 234 generates a first modified data sector 400b (illustrated in FIG. 4c) from the data sector 400a, by correcting each of data tiles 15 and 16 (e.g., by replacing all the 0s in the data tiles 15 and 16 by 1s) in the data sector 400a. Thus, the first modified data sector 400b includes user data tiles 1, . . . , 14 of the data sector 400a, and the corrected nuisance data tiles 15 and 16. The correction of nuisance data tiles are performed by replacing data bits of data tiles 15 and 16 by original data bits (e.g., all 1s) of nuisance data. At 320, the ECC decoder unit 232 also decodes the first modified data sector 400b to generate a second decoded data sector.

At 324, the ECC decoder unit 232 checks to see if all errors have been corrected by the decoding operation at 320 (e.g., check for errors in the second decoded data sector). In case no errors are detected, at 326, the decoding operation is successful.

One or more errors may be detected at 324 because of, for example, the ECC decoder unit 232 being unable to correct all the errors in the second decoded data sector. Also, there is a possibility that one or both the data tiles 15 and 16 have been wrongly identified as nuisance data tiles at 316. For example, data tiles 15 and/or 16 are user data tile with high number of 1s (e.g., user data tile with hamming weight more than the threshold hamming weight of 1900), due to which the identification of the data tiles 15 and/or 16 as a nuisance data tile is wrong. In such a case, correction of data tiles 15 and 16 at 320 further increases the error in the first modified data sector 400b, because of which the ECC decoder unit 232 fails to correctly decode the first modified data sector 400b at 320.

Figure 4D:
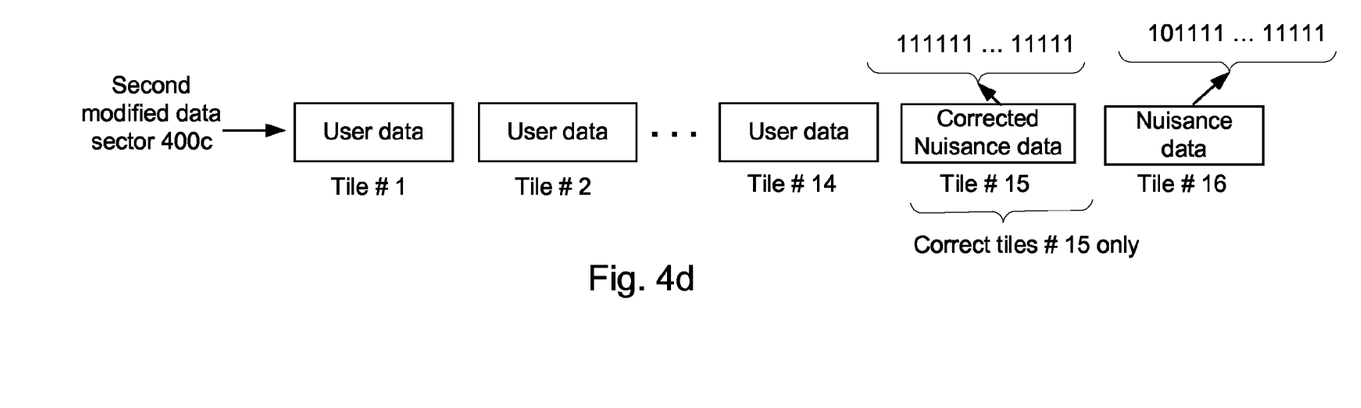
FIG. 4d illustrates an example of a second modified data sector.

Assuming that only one of the two data tiles 15 and 16 (e.g., data tile 16) was incorrectly identified as nuisance data tiles (e.g., assuming that data tile 15 is the only nuisance data tile in the data sector 400a, and data tile 16 is actually a user data tile), at 328, the nuisance data tile correction unit 234 generates a second modified data sector 400c (illustrated in FIG. 4d) from the data sector 400a, by correcting data tile 15 (but not data tile 16) in the data sector 400a. Thus, the second modified data sector 400c includes data tiles 1, . . . , 14 and 16 of data sector 400a, and corrected data tile 15. At 328, the ECC decoder unit 232 also decodes the second modified data sector 400c to generate a third decoded data sector.

At 332, the ECC decoder unit 232 checks to see if all errors have been corrected by the decoding operation at 328 (e.g., check for errors in the third decoded data sector). In case no errors are detected, at 328, the decoding operation is successful.

Figure 4E:
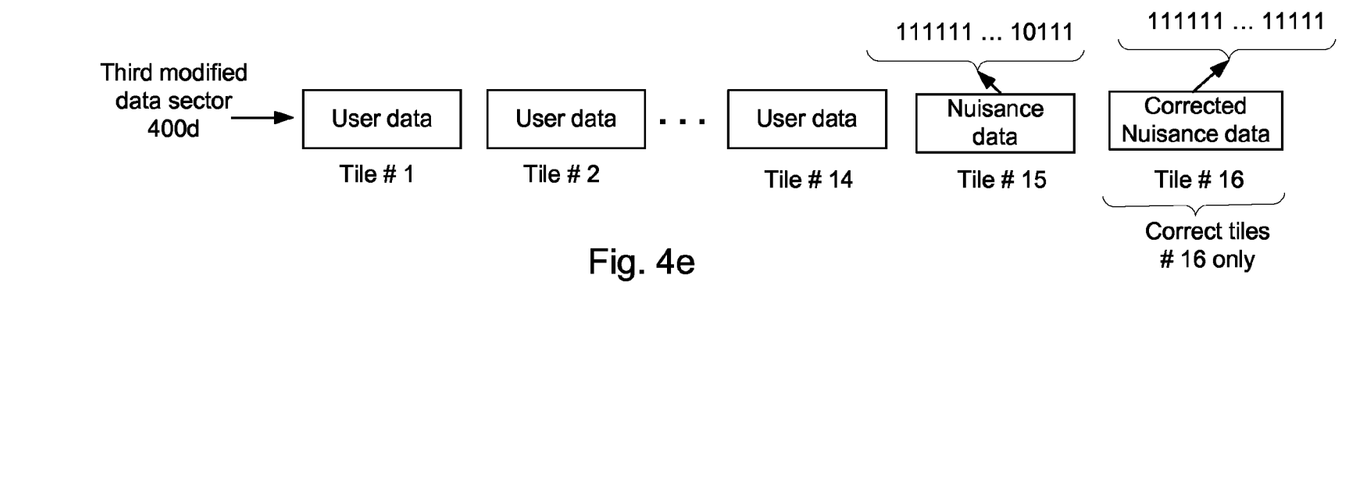
FIG. 4e illustrates an example of a third modified data sector.

In case one or more errors are detected in the third decoded data sector, at 336, the nuisance data tile correction unit 234 generates a third modified data sector 400d (illustrated in FIG. 4e) from the data sector 400a, by correcting data tile 16 (but not data tile 15) in the data sector 400a (e.g., by assuming that the data tile 16 is the only nuisance data tile in the data sector 400a, and data tile 15 is a user data tile). Thus, the third modified data sector 400d includes data tiles 1, . . . , 15 of data sector 400a, and the corrected data tile 16. At 336, the ECC decoder unit 232 also decodes the third modified data sector 400d to generate a fourth decoded data sector.

At 340, the ECC decoder unit 232 checks to see if all errors have been corrected by the decoding operation at 336 (e.g., check for errors in the fourth decoded data sector). In case no errors are detected, at 338, the decoding operation is successful. In case errors are detected, at 344, the decoding operation fails.

Figure 5:
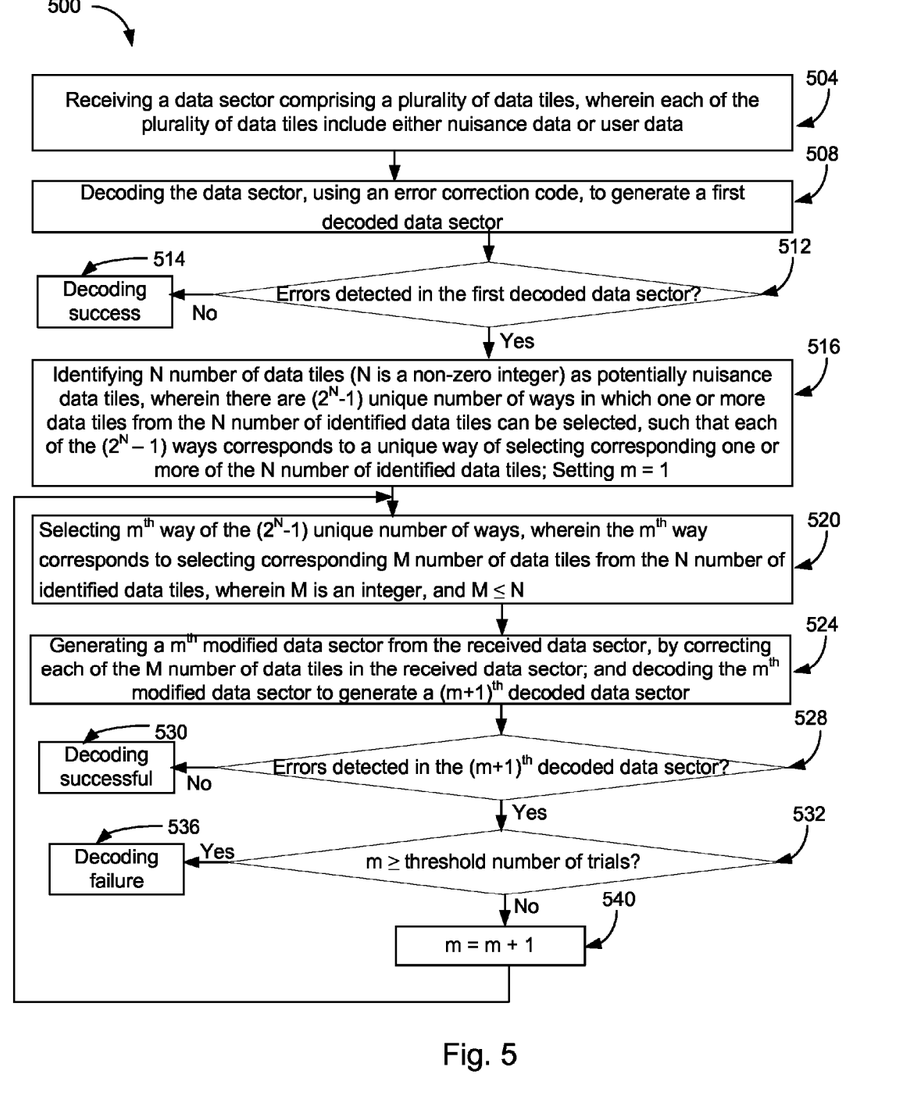
FIG. 5 illustrates another example of a method for decoding a data sector.

Although the data sector 400a in the method 300 includes only 2 potential nuisance data tiles (e.g., data tiles 15 and 16), in various other embodiments, a data sector may include any number of potential nuisance data tiles. FIG. 5 illustrates another example of a method 500 for decoding a data sector by the decoder unit 230. In the method 500, N number (N is a non-zero integer) of data tiles (instead of 2 data tiles in method 300 of FIG. 3) are identified as potential nuisance data tiles.

Referring to FIGS. 2 and 5, method 500 includes, at 504, the decoder unit 230 receiving a data sector comprising a first plurality of data tiles, wherein each of the first plurality of data tiles include either nuisance data or user data. At 508, the ECC decoder unit 232 decodes the received data sector, using an error correction code, to generate a first decoded data sector. At 512, the ECC decoder unit 232 checks for errors in the first decoded data sector. In case no errors are detected, at 514, the decoding operation is successful.

In case one or more errors are detected at 512, the data tile identification unit 233, at 516, identifies, in response to determining the one or more errors, N number of data tiles (N is a non-zero integer) as potential nuisance data tiles. Identification of data tiles as potential nuisance data tiles has been discussed earlier in more detail, e.g., with respect to block 316 of FIG. 3. There are $(2^N-1)$ unique number of ways in which one or more data tiles from the N number of data tiles can be selected, such that each of the $(2^N-1)$ ways corresponds to a unique way of selecting corresponding one or more of the N number of data tiles. For example, if N=2, and a first data tile and second data tile are identified as potential nuisance data tiles, then the two identified data tiles can be selected in $(2^2-1)$, i.e., 3 number of ways (e.g., both first and second data tiles; the first data tile; and the second data tile). Thus, for example, a first way of the three ways corresponds to selecting both the first and second data tiles; a second way of the three ways corresponds to selecting only the first data tile; and a third way of the three ways corresponds to selecting only the second data tile, although the data tiles corresponding to each of the three ways may be selected in a different order as well.

In another example, if N=3, and a first data tile, a second data tile, and a third data tile are identified as potential nuisance data tiles, then one or more of the three identified data tiles can be selected in $(2^3-1)$, i.e., 7 unique number of ways (e.g., first, second and third data tiles; first and second data tiles; first and third data tiles; second and third data tiles; first data tile; second data tile; and third data tile). Thus, for example, a first way of the seven ways corresponds to selecting the first, second and third data tiles; a second way corresponds to selecting the first and second data tiles; a third way corresponds to selecting the first and third data tiles; a fourth way corresponds to selecting the second and third data tiles; a fifth way corresponds to selecting only the first data tile; a sixth way corresponds to selecting only the second data tile; and a seventh way corresponds to selecting only the third data tile, although in various other embodiments, the data tiles corresponding to each of the seven ways may be selected in any different order as well.

Referring again to FIG. 5, the method 500 further includes, at 516, setting by the decoder unit 230, a counter m=1, wherein the counter keeps tracks of the $(2^N-1)$ number of ways. At 520, the decoder unit 230 selects the $m^{th}$ way of the $(2^N-1)$ unique number of ways, wherein the $m^{th}$ way corresponds to selecting corresponding M number of data tiles from the N number of identified data tiles, wherein M is an integer, and M≤N. Thus, in the above discussed example where N=3 and there are 7 unique ways of selecting the three identified data tiles, at 520, for m=1, a first way is selected, where the first way corresponds to selecting, for example, all three of the identified data tiles.

At 524, the nuisance data tile correction unit 234 generates an $m^{th}$ modified data sector from the received data sector, by correcting each of the corresponding M number of data tiles in the received data sector. For example, for N=3 and m=1, at 524, the nuisance data tile correction unit 234 generates a $1^{st}$ modified data sector from the received data sector, by correcting each of the three identified data tiles in the received data sector. At 524, the ECC decoder unit 232 also decodes the $m^{th}$ modified data sector to generate an $(m+1)^{th}$ decoded data sector.

At 528, the ECC decoder unit 232 checks the (m+1)$^{th}$ decoded data sector for errors. If no error is detected, at 530, the decoding is successful.

In case one or more errors are detected at 528 in the (m+1)$^{th}$ decoded data sector, then the decoder unit 230 determines, at 532, if the counter m has reached a threshold number of trials. For example, the threshold number of trials may be less than or equal to the maximum possible ways ($2^N-1$), and the threshold number of trials may be a user adjustable parameter. If the counter m at 532 is equal to or greater than the threshold number of trials, the decoding fails at 536. Otherwise, at 540, the counter m is incremented by one (e.g., m=m+1), and the method continues at 520.

Thus, the iterative method comprising operations at 520, 524, 528 and 532 continues either until the decoding is successful or until at least a threshold number of iterative trials (each trial corresponding to one of the ($2^N-1$) unique number of ways) have been completed. Also, during each iterative trial, a corresponding number of potential nuisance data tiles are corrected in the received data sector, and the corrected data sector is decoded using an ECC and checked for errors.

Decoding a data sector using method 300 and/or method 500 has several advantages. For example, even though the data sector may include a tile indicator field to identify nuisance data tiles and user data tiles, the tile indicator field included in the data sector received by the decoder unit 230 may also include one or more errors. This may prevent correct identification of nuisance data tiles and user data tiles. However, the method 300 and/or method 500 does not depend on the possibly erroneous tile indicator field, because of which the probability of correctly identifying and correcting nuisance data tiles increases. Also, method 300 and/or method 500 identify and correct nuisance data tiles and correctly decode the data sector, even before the tile indicator field is decoded and read (e.g., the tile indicator field is correctly decoded with the correct decoding of the data sector). Also, once the potential nuisance data tiles are corrected using method 300 and/or method 500, decoding the modified data sectors are equivalent to a case where nuisance data is not encoded (and/or where nuisance data is assumed to be correct), which increases the efficiency of the ECC decoding unit (as the generated parities are used only to correct user data tiles, and errors in nuisance data tiles are corrected automatically by the data tile correction unit).

Figure 6:
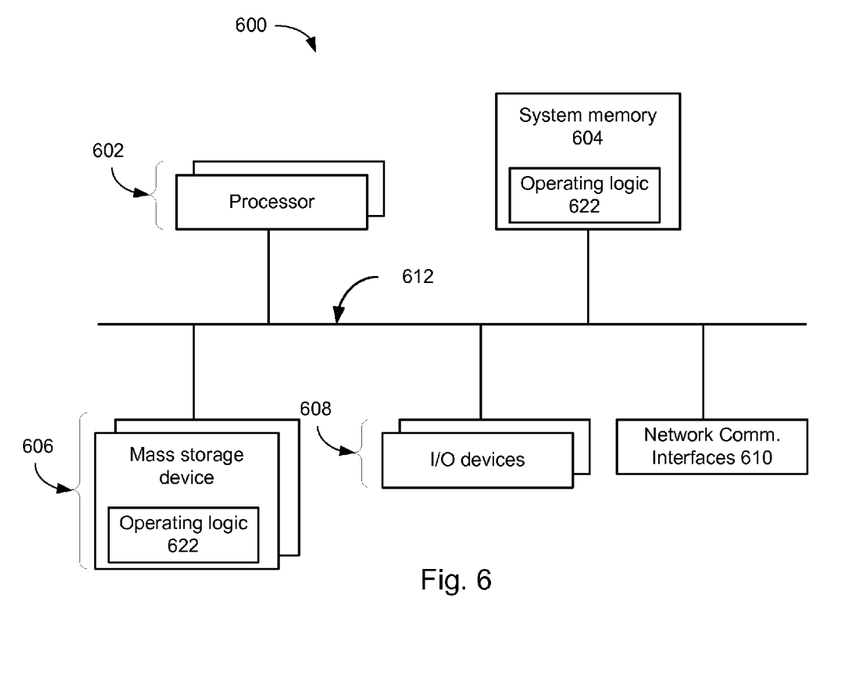
FIG. 6 schematically illustrates a simplified block diagram of a system in which various embodiments of the present disclosure may be implemented.

FIG. 6 schematically illustrates a simplified block diagram of a system 600 in which embodiments of the present disclosure may be implemented. As illustrated, system 600 includes one or more processors or processor cores 602, and system memory 604. For the purpose of this application, including the claims, the terms "processor" and "processor cores" may be considered synonymous, unless the context clearly requires otherwise. Additionally, system 600 includes mass storage devices 606 (such as diskette, hard drive, compact disc read only memory (CDROM) and so forth), input/output devices 608 (such as a display to render visual manifestation, a keyboard, a cursor control, and so forth) and communication interfaces 610 (such as network interface cards, modems and so forth). The elements of FIG. 6 may be operatively coupled to each other via system bus 612, which represents one or more buses. In the case of multiple buses, they may be bridged by one or more bus bridges (not illustrated).

Each of these elements performs typical functions. For example, system memory 604 and mass storage 606 may be employed to store a working copy and a permanent copy of the programming instructions implementing all or a portion of earlier described functions, herein collectively denoted as operating logic 622. The operating logic 622 may be assembler instructions supported by processor(s) 602 or instructions that can be compiled from high level languages, such as C.

The permanent copy of the programming instructions may be placed into permanent storage 606 in the factory, or in the field, through, for example, a distribution medium (not shown), such as a compact disc (CD), or through communication interface 610 (from a distribution server (not shown)). That is, one or more distribution media having operating logic 622 may be employed to distribute the operating logic 622 and program various computing devices.

In an embodiment, the processor(s) 602 are configured to perform one or more operations of various units illustrated in FIG. 2. For example, the processor(s) 602 are configured to perform one or more operations of the decoder unit 230, including one or more operations of the nuisance data tile correction unit 234, ECC decoder unit 232 and/or data tile identification unit 233. The processor(s) 602 are configured to perform one or more operations of method 300 and/or method 500 of FIGS. 3 and 5, respectively.

In embodiments of the present disclosure, a machine-readable medium having associated instructions, which, when executed, instructs a machine to implement one or more methods (e.g., methods 300 and/or 500) as disclosed herein. For example, in example embodiments, a machine-readable medium comprises a storage medium and a plurality of programming instructions stored in the storage medium and adapted to program the machine to receive a data sector comprising a first plurality of data tiles, wherein each of the first plurality of data tiles includes either nuisance data or user data; decode the data sector, using an error correction code, to generate a first decoded data sector; determine an error in the first decoded data sector; identify, in response to determining the error, a second plurality of data tiles from the first plurality of data tiles, such that each of the identified second plurality of data tiles potentially includes nuisance data; and generate a first modified data sector from the data sector, by correcting at least one of the second plurality of data tiles in the data sector.

Although specific embodiments have been illustrated and described herein, it will be appreciated by those of ordinary skill in the art and others, that a wide variety of alternate and/or equivalent implementations may be substituted for the specific embodiment illustrated and described without departing from the scope of the present disclosure. This present disclosure covers all methods, apparatus, and articles of manufacture fairly falling within the scope of the appended claims either literally or under the doctrine of equivalents. This application is intended to cover any adaptations or variations of the embodiment discussed herein. Therefore, it is manifested and intended that the disclosure be limited only by the claims and the equivalents thereof.

What is claimed is:

1. A method comprising:
    receiving a data sector comprising a plurality of data tiles, wherein each data tile of the plurality of data tiles respectively includes either (i) non-user data having a predetermined repetitive pattern or (ii) user data;
    decoding the data sector; and
    in response to determining an error while decoding the data sector,
        i) identifying a subset of the plurality of data tiles that potentially includes non-user data having the predetermined repetitive pattern, ii) identifying a first data tile of the subset of the plurality of data tiles, such that the first data tile of the subset of the plurality of data tiles potentially has one or more errors, iii) correcting the one or more errors of the first data tile of the subset of the plurality of data tiles in the data sector, and iv) decoding the data sector, with the one or more errors of the first data tile of the subset of the plurality of data tiles in the data sector being corrected.

2. The method of claim 1, further comprising:
in response to determining an error while decoding the data sector, with the one or more errors of the first data tile of the subset of the plurality of data tiles in the data sector being corrected,
  i) identifying a second data tile of the subset of the plurality of data tiles, such that the second data tile of the subset of the plurality of data tiles potentially has one or more errors,
  ii) correcting the one or more errors of the second data tile of the subset of the plurality of data tiles in the data sector, and
  iii) decoding the data sector, with the one or more errors of the second data tile of the subset of the plurality of data tiles in the data sector being corrected.

3. The method of claim 2, wherein decoding the data sector, with the one or more errors of the second data tile of the subset of the plurality of data tiles in the data sector being corrected further comprises:
decoding the data sector, with the one or more errors of the second data tile of the subset of the plurality of data tiles in the data sector being corrected, while not correcting the one or more errors of the first data tile of the subset of the plurality of data tiles in the data sector.

4. The method of claim 2, wherein decoding the data sector, with the one or more errors of the second data tile of the subset of the plurality of data tiles in the data sector being corrected further comprises:
decoding the data sector, with (i) the one or more errors of the second data tile of the subset of the plurality of data tiles in the data sector and (ii) the one or more errors of the first data tile of the subset of the plurality of data tiles in the data sector being corrected.

5. The method of claim 1, wherein correcting the one or more errors of the first data tile of the subset of the plurality of data tiles in the data sector further comprises:
replacing data bits in the first data tile of the subset of the plurality of data tiles in the data sector by the predetermined repetitive pattern of the non-user data.

6. The method of claim 1, wherein identifying the subset of the plurality of data tiles that potentially includes non-user data having the predetermined repetitive pattern further comprises:
determining a hamming weight of each of the plurality of data tiles of the data sector; and
based on determining the hamming weight of each of the plurality of data tiles of the received data sector, identifying the subset of the plurality of data tiles that potentially includes non-user data having the predetermined repetitive pattern.

7. The method of claim 6, wherein each of the plurality of data tiles that potentially includes non-user data having the predetermined repetitive pattern has a hamming weight higher than a predetermined threshold.

8. The method of claim 6, wherein each of the plurality of data tiles that potentially includes non-user data having the predetermined repetitive pattern has a hamming weight lower than a predetermined threshold.

9. The method of claim 1, wherein the predetermined repetitive pattern of the non-user data is not based on the user data.

10. An apparatus comprising a decoder unit configured to receive a data sector comprising a plurality of data tiles, wherein each data tile of the plurality of data tiles respectively include either (i) non-user data having a predetermined repetitive pattern or (ii) user data, wherein the decoder unit comprises:
an error correction code (ECC) decoder unit configured to
  decode the data sector, and
  determine an error while decoding the data sector;
a data tile identification unit configured to, in response to the ECC decoder unit determining the error while decoding the received data sector,
  identify a subset of the plurality of data tiles that potentially includes non-user data having the predetermined repetitive pattern, and
  identify a first data tile of the subset of the plurality of data tiles, such that the first data tile of the subset of the plurality of data tiles potentially has one or more errors; and
a data tile correction unit configured to correct, in response to the ECC decoder unit determining the error while decoding the data sector, the one or more errors of the first data tile of the subset of the plurality of data tiles in the data sector,
wherein the ECC decoder unit is further configured to decode the data sector, with the one or more errors of the first data tile of the subset of the plurality of data tiles in the data sector being corrected.

11. The apparatus of claim 10, wherein:
the ECC decoder unit is further configured to determine an error while decoding the data sector, with the one or more errors of the first data tile of the subset of the plurality of data tiles in the data sector being corrected; and
in response to the ECC decoder unit determining the error while decoding the data sector, with the one or more errors of the first data tile of the subset of the plurality of data tiles in the data sector being corrected,
  i) the data tile identification unit is further configured to identify a second data tile of the subset of the plurality of data tiles, such that the second data tile of the subset of the plurality of data tiles potentially has one or more errors,
  ii) the data tile correction unit is further configured to correct the one or more errors of the second data tile of the subset of the plurality of data tiles in the data sector, and
  iii) the ECC decoder unit is further configured to decode the data sector, with the one or more errors of the second data tile of the subset of the plurality of data tiles in the data sector being corrected.

12. The apparatus of claim 11, wherein the ECC decoder unit is further configured to decode the data sector, with the one or more errors of the second data tile of the subset of the plurality of data tiles in the data sector being corrected, while the one or more errors of the first data tile of the subset of the plurality of data tiles in the data sector is not corrected.

13. The apparatus of claim 11, wherein the ECC decoder unit is further configured to decode the data sector, with (i) the one or more errors of the second data tile of the subset of the plurality of data tiles in the data sector and (ii) the one or more errors of the first data tile of the subset of the plurality of data tiles in the data sector being corrected.

14. The apparatus of claim 10, wherein the data tile correction unit is configured to correct, in response to the ECC decoder unit determining the error while decoding the data sector, the one or more errors of the first data tile of the subset of the plurality of data tiles in the data sector by:
   replacing data bits in the first data tile of the subset of the plurality of data tiles in the data sector by the predetermined repetitive pattern of the non-user data.

15. The apparatus of claim 10, wherein the data tile identification unit is configured to identify the subset of the plurality of data tiles that potentially includes non-user data having the predetermined repetitive pattern by:
   determining a hamming weight of each of the plurality of data tiles of the data sector; and
   based on determining the hamming weight of each of the plurality of data tiles of the received data sector, identifying the subset of the plurality of data tiles that potentially includes non-user data having the predetermined repetitive pattern.

16. The apparatus of claim 15, wherein each of the plurality of data tiles that potentially includes non-user data having the predetermined repetitive pattern has a hamming weight higher than a predetermined threshold.

17. The apparatus of claim 15, wherein each of the plurality of data tiles that potentially includes non-user data having the predetermined repetitive pattern has a hamming weight lower than a predetermined threshold.

18. The apparatus of claim 10, wherein the predetermined repetitive pattern of the non-user data is not based on the user data.

* * * * *